United States Patent [19]

Gleason et al.

[11] Patent Number: 4,853,627

[45] Date of Patent: Aug. 1, 1989

[54] WAFER PROBES

[75] Inventors: Kimberly R. Gleason; Eric W. Strid, both of Portland; Robert T. Flegal, Beaverton; Angus J. McCamant, Aloha, all of Oreg.

[73] Assignee: TriQuint Semiconductor, Inc., Beaverton, Oreg.

[21] Appl. No.: 217,107

[22] Filed: Jul. 11, 1988

Related U.S. Application Data

[63] Continuation of Ser. No. 812,480, Dec. 23, 1985, abandoned.

[51] Int. Cl.[4] .................... G01R 1/06; G01R 31/02
[52] U.S. Cl. ..................... 324/158 P; 324/72.5; 324/158 F
[58] Field of Search ........... 324/158 P, 158 F, 73 PC, 324/72.5

[56] References Cited

U.S. PATENT DOCUMENTS

| | | | |
|---|---|---|---|
| 3,596,228 | 7/1971 | Reed, Jr. | 324/158 P |
| 4,099,119 | 7/1978 | Goetz | 324/73 PC |
| 4,161,692 | 7/1979 | Tarzwell | 324/158 F |
| 4,574,235 | 3/1986 | Kelly et al. | 324/158 P |

OTHER PUBLICATIONS

Picoprobe by GGB Industries; brochure from GGB Industries, Gillette, N.J.; 3 pages.
Strid et al; "A DC-12 GHz Monolithic . . ."; IEEE Transactions on Microwave Theory and Techniques; vol. MTT-30; No. 7; Jul. 1982; pp. 969–975.

*Primary Examiner*—Ernest F. Karlsen
*Attorney, Agent, or Firm*—John Smith-Hill; William S. Lovell

[57] ABSTRACT

A wafer probe comprises a support member having an end region which is shaped to permit the end region to be brought into close proximity with a component under test. An amplifier is mounted on the support member at its end region. A conductive probe element is attached to the amplifier and is electrically connected to the amplifier's input terminal. A transmission line is connected to the amplifier's output terminal for transmitting signals from the amplifier to a measurement instrument.

20 Claims, 1 Drawing Sheet

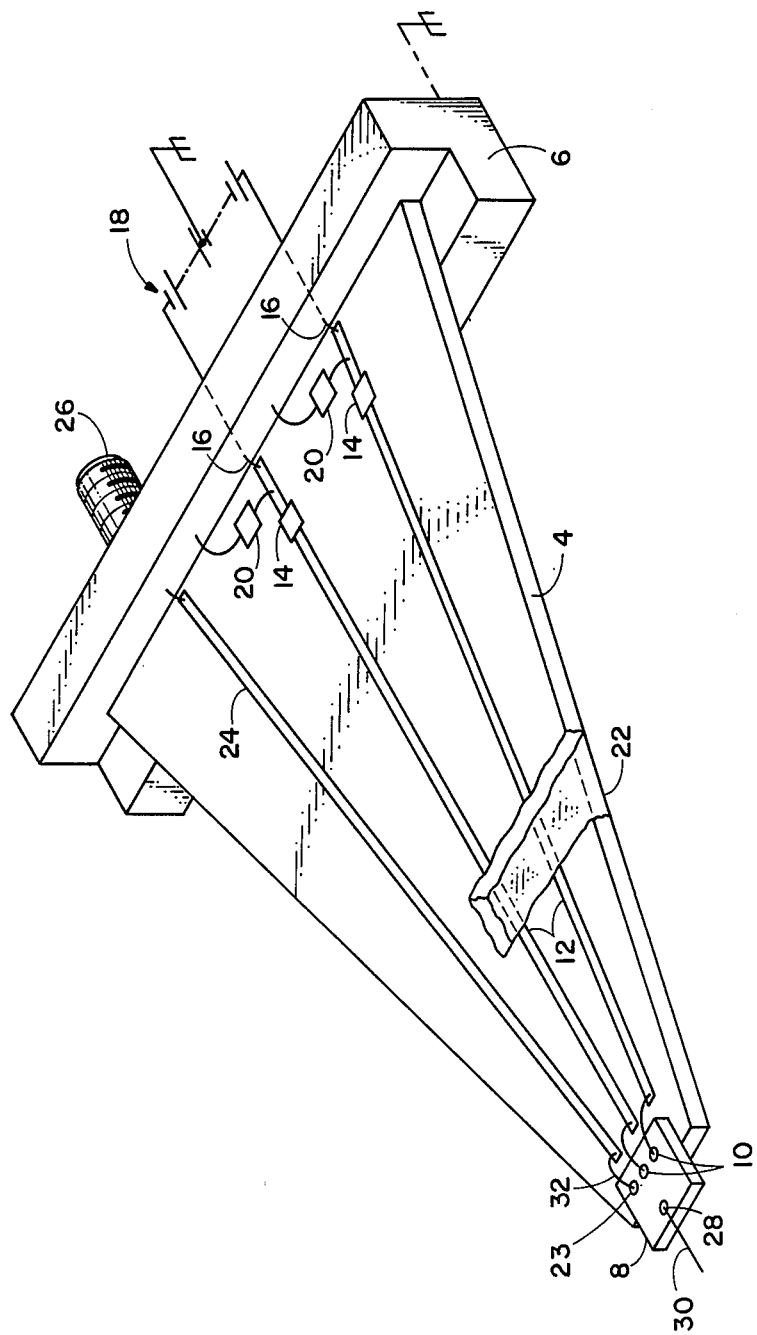

WAFER PROBES

The Government has rights in this invention pursuant to contract No. F33615-C-1774 awarded by the Department of the Air Force.

This is a continuation of application Ser. No. 812,480 filed 12-23-85, and now abandoned.

This invention relates to wafer probes.

BACKGROUND OF THE INVENTION

In fabrication of integrated circuit chips, it is conventional to form many identical chips concurrently on a common wafer of semiconductor material, and subsequently dice the wafer into individual chips for packaging. It is well-known to use a wafer probe in order to test the individual chips prior to dicing and packaging.

A wafer probe is described in U.S. patent application Ser. No. 318,084 filed Nov. 4, 1981. That wafer probe comprises a plate-like substrate member of dielectric material. In use, the substrate member is mounted at one end in a probe station, and it carries several probe elements, such as gold beads, at its opposite end. The probe elements are connected to a measurement instrument by transmission lines formed on the substrate member. In order to carry out a test, the probe elements are brought into contact with pads of an integrated circuit under test, and the signals at those pads are transmitted to the measurement instrument.

A disadvantage of the wafer probe described in U.S. patent application Ser. No. 318,084 filed Nov. 4, 1981 is that the relatively low input impedance of the transmission lines (e.g. 50 ohms) results in the possibility that the testing operation might disturb significantly the signal level at the probed pads.

An active wafer probe using an amplifier implemented in silicon and spaced from the probe station is manufactured by G. G. B. Industries of Gillette, N.J.

E. Strid and K. Gleason, "A DC—12GHz Monolithic GaAsFET Distributed Amplifier", IEEE Transactions on Microwave Theory and Techniques, vol. MTT-30, No. 7, pp. 969–975, July 1982, discloses a wafer probe and suggests that passive or active circuit elements may be mounted on the probe tip.

SUMMARY OF THE INVENTION

A wafer probe in accordance with the invention preferably comprises a plate-like substrate member having two opposite ends. In use, the substrate member is mounted at one end in a probe station. The substrate member carries at its opposite end an integrated circuit amplifier having a high input impedance. A probe element is attached to the amplifier and is electrically connected to the amplifier's input terminal. The amplifier's output terminal is connected by way of a transmission line to a measurement instrument.

BRIEF DESCRIPTION OF THE DRAWINGS

For a better understanding of the invention, and to show how the same may be carried into effect, reference will now be made, by way of example, to the accompanying drawing the single figure of which is a partly broken-away perspective view of a wafer probe embodying the present invention.

DETAILED DESCRIPTION

The wafer probe shown in FIG. 1 comprises a substrate 4 of ceramic material. The substrate is generally triangular when viewed from above, and is attached at its base to a mounting block 6. At its apex, the substrate 4 carries a monolithic integrated circuit amplifier 8. The amplifier is a three stage source follower circuit implemented in gallium arsenide and has an input impedance of about 100 megohms in parallel with about 20 fF. The amplifier has power supply terminals 10 that are connected through microstrip conductors 12 and 50 ohm resistors 14 to the terminals 16 of a D. C. voltage supply 18. The substrate 4 carries at its underside a continuous layer 22 of conductive material which is grounded by way of the block 6. The microstrip conductors 12 and the layer 22 constitute two power-supply transmission lines each having a characteristic impedance of 50 ohms. The transmission lines are terminated in their characteristic impedance by the resistors 14. By-pass capacitors 20 are connected between the terminals 16 and the mounting block 6. Therefore, perturbations in the power supply voltages are not transmitted to the amplifier S.

A third microstrip conductor 24 is connected to the output terminal of the amplifier 8 by a short (e.g., about 0.4 mm) bond wire 32 and extends between the amplifier 8 and the central conductor of a coaxial connector 26. The conductor 24 and the layer 22 together constitute a third transmission line. The coaxial connector is used for connecting the third transmission line to a measurement and display instrument, such as a sampling oscilloscope. The amplifier also has an input terminal 28, which is connected to a conductive probe element 30. The probe element 30 may comprise, for example, a 0.018 mm diameter bond wire that is attached to the input terminal pad of the amplifier 8.

In use, the illustrated probe is mounted by way of the mounting block in a probe station, and the probe is positioned so that the probe element 30 contacts a node of interest in a circuit under test. A ground connection and other power supply voltages are connected to the circuit under test by way of other probes of conventional design. Signals developed at the node of interest are applied to the input terminal of the amplifier 8 by way of the probe element 30 and are transmitted by way of the output terminal, the bond wire 32, the transmission line 24 and the connector 26 to the measurement and display instrument (not shown). Through use of the amplifier 8, a very high input impedance is presented to the node of interest, and accordingly the operation of the circuit under test is not perturbed significantly by the testing operation. The amplifier 8 has a relatively low output impedance and accordingly is well matched to the transmission line 24. Because the bond wire 32 is the only non-transmission line conductor between the amplifier 8 and the measurement and display instrument, and is very short, the output signal of the amplifier suffers very little degradation.

As noted previously, the input impedance of the amplifier 8 is very high. This stems from the fact that the value of $G_m*Z_g$ for a field effect transistor implemented in gallium arsenide (where $G_m$ is the transconductance of the transistor and $Z_g$ is its gate impedance) is high. $G_m*Z_g$ is proportional to $F_t$, or the frequency for unity current gain, of the transistor. The value of $F_t$ for the transistors used in the amplifier 8 is about 13 GHz, and any material could be used for implementation of the amplifier B provided that a field effect transistor fabricated in the material has a value of $F_t$ of at least about 13 GHz.

Because the input impedance of the amplifier 8 is very high, the inductance of the probe element 30 does not degrade significantly the input signal applied to the probe element. Nevertheless, in order to minimize reception of stray signals by virtue of the probe element 30 acting as an antenna, the length of the probe element must be kept to a minimum. It is therefore desirable that the probe element be less than about 1.25 mm long, and it is preferred that it be less than about 0.25 mm long. Consequently, the inductance of the probe element is small also and does not contribute to signal degradation.

It is preferred that the amplifier circuit be a three stage source follower amplifier, because although that circuit has a low gain it has relatively good linearity. A buffered-FET logic amplifier has the advantage of a higher gain, but the poor linearity of that circuit renders it unsuitable for accurate measurements on analog signals.

Because the amplifier 8 has a very high input impedance, the conductor that connects the circuit under test to ground can have quite a high impedance and therefore can be quite long. This makes it possible for the ground connection to the circuit under test to be made by way of a separate probe, rather than by way of a second probe element carried by the substrate 4.

It is necessary to protect the input stage of the amplifier 8 against large input voltages. This may be accomplished by use of resistors and diodes that limit the input signal to the supply voltages.

It will be appreciated that the present invention is not restricted to the particular probe head that has been described and illustrated, and that variations may be made therein without departing from the scope of the invention as defined in the appended claims, and equivalents thereof. For example, instead of microstrip transmission lines, with the signal and ground conductors on opposite sides of the substrate 4, coplanar transmission lines may be used. Alternatively, a microtube transmission line may be used for connecting the output terminal of the amplifier to the measurement instrument. In this case, the amplifier 8 would be mounted near the end of the microtube transmission line and wires would be used to connect the amplifier to the bias supply 18. The by-pass capacitors 20 would be mounted near the amplifier. It is not essential to the invention that a monolithic integrated circuit be used for the amplifier 8, since a hybrid circuit may be used instead.

We claim:

1. A wafer probe comprising:
    a planar, generally triangular plate-form support member having first and second opposite main faces and having an end region at a smaller end thereof which is shaped to permit said end region to be brought into close proximity with a component under test,
    an amplifier mounted on the support member at said end region and having an input terminal, an output terminal and first and second power supply terminals,
    a conductive probe element attached to the amplifier and electrically connected to said input terminal,
    a transmission line mounted on said planar support member and connected to the output terminal for transmitting signals from the amplifier to a measurement instrument, said transmission line being formed by a strip of conductive material deposited on the first main face of the support member and a layer of electrically conductive material deposited on the second main face of the support member in electrically insulating relationship with respect to said strip,
    first and second conductors for connecting the power supply terminals respectively to a power supply, said first and second conductors comprising strips of conductive material deposited on the first main face of the support member, and
    by-pass capacitors spaced from said end region of the support member and connected between said first and second conductors and said layer of electrically conductive material.

2. A wafer probe according to claim 1, wherein in the amplifier is a multi-stage source follower amplifier.

3. A probe according to claim 1, wherein the amplifier is a monolithic buffered FET logic amplifier.

4. A probe according to claim 1, wherein the probe element has a length of from about 0.25 mm to about 1.25 mm and a thickness of about 0.018 mm.

5. A probe according to claim 1, wherein the amplifier is implemented in a monolithic integrated circuit chip and the terminals of the amplifier are constituted by respective terminal pads on the integrated circuit chip.

6. A probe according to claim 5, wherein the probe element is a wire having a length from about 0.25 mm to about 1.25 mm and a thickness of about 0.018 mm, the wire being attached in electrically conductive fashion to the input terminal pad of the integrated circuit chip.

7. A wafer probe comprising:
    a planar support member having an end region that is shaped to permit the end region to be brought into close proximity with a component under test, and a support region that is spaced from said end region,
    an electronic circuit mounted on the support member at the end region thereof and having an input terminal, an output terminal and first and second power supply terminals,
    a conductive probe element attached to the electronic circuit and electrically connected to said input terminal,
    a transmission line connected to the output terminal and extending to said support region for transmitting signals from the electronic circuit to a measurement instrument, and
    first and second power-supply transmission lines connected to the power supply terminals respectively and extending from those terminals to said support region of the planar support member.

8. A probe according to claim 7, wherein the support member is a plate-form member having first and second opposite main faces, and the power-supply transmission lines are formed by respective strips of conductive material deposited on the first main face of the support member and a layer of electrically conductive material deposited on one of said main faces of the support member in electrically insulating relationship with respect to said strips.

9. A probe according to claim 7, wherein the power-supply transmission lines comprise first and second conductors connected to the power supply terminals respectively and a third conductor in electrically insulating relationship with respect to the first and second conductors, for connection to a reference potential level.

10. A probe according to claim 9, comprising first and second resistors connected to the first and second conductors respectively at the support region of the support member, and by-pass capacitors connected between the resistors respectively and the third conductor.

11. A probe according to claim 10, wherein the support member is a plate-form member having first and second opposite main faces and the first and second conductors comprise respective strips of conductive material deposited on the first main face of the support member and the third conductor comprises a layer of electrically conductive material deposited on one said main faces of the support member.

12. A probe according to claim 9, comprising first and second by-pass capacitors at the support region of the support member and connected between the first and second conductors respectively and the third conductor.

13. A probe according to claim 7, wherein the probe element is a wire having a length from about 0.25 mm to about 1.25 mm and a thickness of about 0.018 mm, the wire being attached in electrically conductive fashion to the input terminal of the electronic circuit.

14. A probe according to claim 7, wherein the electronic circuit is implemented in a monolithic integrated circuit chip and the terminals of the electronic circuit are constituted by respective terminal pads on the integrated circuit chip.

15. A probe according to claim 7, wherein the first and second power-supply transmission lines are connected at the support region to first and second resistors respectively, each having a resistance value equal to the characteristic impedance of the power-supply transmission lines.

16. A probe according to claim 7, comprising first and second by-pass capacitors at the support region of the support member and connected between the power-supply transmission lines respectively and a reference potential level.

17. A probe according to claim 7, wherein the support member is generally triangular in shape, the end region of the support member being at one apex of the triangle and the support region being at the base opposite said one apex.

18. A probe according to claim 7, wherein the electronic circuit is an amplifier.

19. A probe according to claim 7, wherein the electronic circuit is an amplifier having an input impedance on the order of about 100 megohms.

20. A probe according to claim 19, wherein the amplifier is implemented in a monolithic integrated circuit chip and the terminals of the amplifier are constituted by respective terminal pads on the integrated circuit chip.

* * * * *